(12) United States Patent
Shtein et al.

(10) Patent No.: US 7,561,772 B2
(45) Date of Patent: Jul. 14, 2009

(54) ORGANIC DEVICES HAVING A FIBER STRUCTURE

(75) Inventors: Max Shtein, Ann Arbor, MI (US); Stephen R. Forrest, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 107 days.

(21) Appl. No.: 11/725,641

(22) Filed: Mar. 19, 2007

(65) Prior Publication Data

US 2008/0025681 A1  Jan. 31, 2008

Related U.S. Application Data

(62) Division of application No. 10/892,465, filed on Jul. 16, 2004, now Pat. No. 7,194,173.

(51) Int. Cl.
*G02B 6/036* (2006.01)
*G02B 6/12* (2006.01)

(52) U.S. Cl. ...................................... 385/128; 385/131
(58) Field of Classification Search .......... 385/123–132
See application file for complete search history.

(56) References Cited

FOREIGN PATENT DOCUMENTS

EP  1 180 805 A2 * 2/2002

* cited by examiner

*Primary Examiner*—Kevin S Wood
(74) *Attorney, Agent, or Firm*—Duane Morris LLP

(57) ABSTRACT

A photoactive fiber is provided, as well as a method of fabricating such a fiber. The fiber has a conductive core including a first electrode. An organic layer surrounds and is electrically connected to the first electrode. A transparent second electrode surrounds and is electrically connected to the organic layer. Other layers, such as blocking layers or smoothing layers, may also be incorporated into the fiber. The fiber may be woven into a cloth.

6 Claims, 4 Drawing Sheets

ORGANIC DEVICES HAVING A FIBER STRUCTURE

This application is a division of and claims the benefit of priority of U.S. patent application Ser. No. 10/892,465, filed on Jul. 16, 2004, issued as a U.S. Pat. No. 7,194,173, which is hereby incorporated by reference in its entirety.

FIELD OF THE INVENTION

The present invention generally relates to organic optoelectronic devices. More specifically, it is directed to organic optoelectronic devices having a fiber structure.

BACKGROUND OF THE INVENTION

Optoelectronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodectors. Organic materials may have performance advantages over conventional materials. For example, the wavelength at which an organic emissive layer emits light (for OLEDs) may generally be readily tuned with appropriate dopants.

Optoeletronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m², AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, (2) the photovoltage under open circuit conditions, i.e., the open circuit voltage $V_{OC}$, and (3) the fill factor, ff.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, ff, defined as:

$$ff = \{I_{max} V_{max}\} / \{I_{SC} V_{OC}\} \quad (1)$$

where ff is always less than 1, as $I_{SC}$ and $V_{OC}$ are never obtained simultaneously in actual use. Nonetheless, as ff approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = ff * (I_{SC} * V_{OC}) / P_{inc}$$

When electromagnetic radiation of an appropriate energy is incident upon a semiconductive organic material, for example, an organic molecular crystal (OMC) material, or a polymer, a photon can be absorbed to produce an excited molecular state. This is represented symbolically as $S_0 + h\nu \rightarrow S_0^*$. Here $S_0$ and $S_0^*$ denote ground and excited molecular states, respectively. This energy absorption is associated with the promotion of an electron from a bound state in the HOMO energy level, which may be a $\pi$-bond, to the LUMO energy level, which may be a $\pi^*$-bond, or equivalently, the promotion of a hole from the LUMO energy level to the HOMO energy level. In organic thin-film photoconductors, the generated molecular state is generally believed to be an exciton, i.e., an electron-hole pair in a bound state which is transported as a quasi-particle. The excitons can have an appreciable life-time before geminate recombination, which refers to the process of the original electron and hole. recombining with each other, as opposed to recombination with holes or electrons from other pairs. To produce a photocurrent the electron-hole pair becomes separated, typically at a donor-acceptor interface between two dissimilar contacting organic thin films. If the charges do not separate, they can recombine in a geminant recombination process, also known as quenching, either radiatively, by the emission of light of a lower energy than the incident light, or non-radiatively, by the production of heat. Either of these outcomes is undesirable in a photosensitive optoelectronic device.

Electric fields or inhomogeneities at a contact may cause an exciton to quench rather than dissociate at the donor-acceptor interface, resulting in no net contribution to the current. Therefore, it is desirable to keep photogenerated excitons away from the contacts. This has the effect of limiting the diffusion of excitons to the region near the junction so that the associated electric field has an increased opportunity to separate charge carriers liberated by the dissociation of the excitons near the junction.

To produce internally generated electric fields which occupy a substantial volume, the usual method is to juxtapose two layers of material with appropriately selected conductive properties, especially with respect to their distribution of molecular quantum energy states. The interface of these two materials is called a photovoltaic heterojunction. In traditional semiconductor theory, materials for forming PV heterojunctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the highest occupied molecular orbital (HOMO) energy level and the lowest unoccupied molecular orbital (LUMO) energy level, called the HOMO-LUMO gap. The Fermi energy characterizes the statistical occupation of molecular quantum energy states denoted by the value of energy for which the probability of occupation is equal to ½. A Fermi energy near the LUMO energy level indicates that electrons are the predominant carrier. A Fermi energy near the HOMO energy level indicates that holes are the predominant carrier. Accordingly, the Fermi energy is a primary characterizing property of traditional semiconductors and the prototypical PV heterojunction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the heterojunction between appropriately selected materials.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

In the context of organic materials, the terms "donor" and "acceptor" refer to the relative positions of the HOMO and LUMO energy levels of two contacting but different organic materials. This is in contrast to the use of these terms in the inorganic context, where "donor" and "acceptor" may refer to types of dopants that may be used to create inorganic n- and p-types layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. Preferably, but not necessarily, an acceptor material is an ETL and a donor material is a HTL.

Conventional inorganic semiconductor PV cells employ a p-n junction to establish an internal field. Early organic thin film cells, such as reported by Tang et al, *Appl. Phys Lett.* 48, 183 (1986), contain a heterojunction analogous to that employed in a conventional inorganic PV cell. However, it is now recognized that in addition to the establishment of a p-n type junction, the energy level offset of the heterojunction also plays an important role.

The energy level offset at the organic D-A heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$ V/cm) is low. The most efficient exciton dissociation in organic materials occurs at a donor-acceptor (D-A) interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Organic PV cells have many potential advantages when compared to traditional silicon-based devices. Organic PV cells are light weight, economical in materials use, and can be deposited on low cost substrates, such as flexible plastic foils. However, some organic PV devices typically have relatively low external quantum efficiency, being on the order of 1% or less. This is, in part, thought to be due to the second order nature of the intrinsic photoconductive process. That is, carrier generation requires exciton generation, diffusion and ionization or collection. There is an efficiency η associated with each of these processes. Subscripts may be used as follows: P for power efficiency, EXT for external quantum efficiency, A for photon absorption, ED for diffusion, CC for collection, and INT for internal quantum efficiency. Using this notation:

$$\eta_P \sim \eta_{NEXT} = \eta_A * \eta_{ED} * \eta_{cc}$$

$$\eta_{EXT} = \eta_A * \eta_{INT}$$

The diffusion length ($L_D$) of an exciton is typically much less ($L_D$~50 Å) than the optical absorption length (~500 Å), requiring a trade off between using a thick, and therefore resistive, cell with multiple or highly folded interfaces, or a thin cell with a low optical absorption efficiency.

Typically, when light is absorbed to form an exciton in an organic thin film, a singlet exciton is formed. By the mechanism of intersystem crossing, the singlet exciton may decay to a triplet exciton. In this process energy is lost which will result in a lower efficiency for the device. If not for the energy loss from intersystem crossing, it would be desirable to use materials that generate triplet excitons, as triplet excitons generally have a longer lifetime, and therefore a longer diffusion length, than do singlet excitons.

SUMMARY OF THE INVENTION

A photoactive fiber is provided, as well as a method of fabricating such a fiber. The fiber has a conductive core including a first electrode. An organic layer surrounds and is electrically connected to the first electrode. A transparent second electrode surrounds and is electrically connected to the organic layer. Other layers, such as blocking layers or smoothing layers, may also be incorporated into the fiber. The fiber may be woven into a cloth.

DETAILED DESCRIPTION

An organic optoelectronic device is provided, having a fiber structure. Various types of organic optoelectronic devices may be provided, including organic photosensitive devices and organic light emitting devices. Embodiments of the present invention may comprise an anode, a cathode, and an organic layer disposed between and electrically connected to the anode and the cathode.

Organic photosensitive devices of embodiments of the present invention may be used, for example, to generate a usable electrical current from incident electromagnetic radiation (e.g., PV devices) or may be used to detect incident electromagnetic radiation. A "photoactive region" is the portion of the photosensitive device that absorbs electromagnetic radiation to generate excitons that may dissociate in order to generate an electrical current. Organic photosensitive optoelectronic devices may include at least one transparent electrode to allow incident radiation to be absorbed by the device. Several PV device materials and configurations are described in U.S. Pat. Nos. 6,657,378, 6,580,027, and 6,352,777, which are incorporated herein by reference in their entirety.

Figure 1:
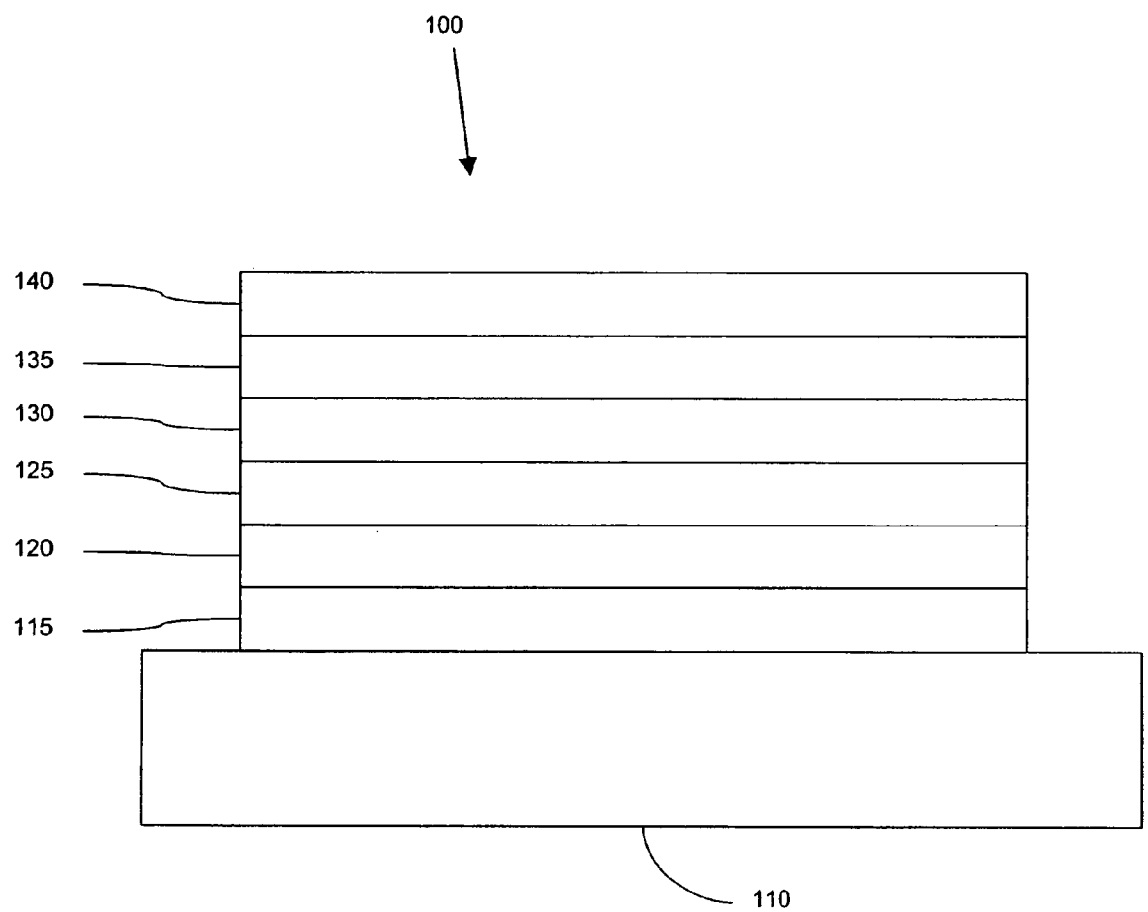
FIG. 1 shows an organic PV device comprising an anode, an anode smoothing layer, a donor layer, an acceptor layer, a blocking layer, and a cathode.

FIG. 1 shows an organic photosensitive optoelectronic device 100. The figures are not necessarily drawn to scale. Device 100 may include a substrate 110, an anode 115, an anode smoothing layer 120, a donor layer 125, an acceptor layer 130, a blocking layer 135, and a cathode 140. Cathode 140 may be a compound cathode having a first conductive layer and a second conductive layer. Device 100 may be fabricated by depositing the layers described, in order. Charge separation may occur predominantly at the organic heterojunction between donor layer 125 and acceptor layer 130. The built-in potential at the heterojunction is determined by the HOMO-LUMO energy level difference between the two materials contacting to form the heterojunction. The HOMO-LUMO gap offset between the donor and acceptor materials produce an electric field at the donor/acceptor interface that facilitates charge separation for excitons created within an exciton diffusion length of the interface.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

Figure 4:
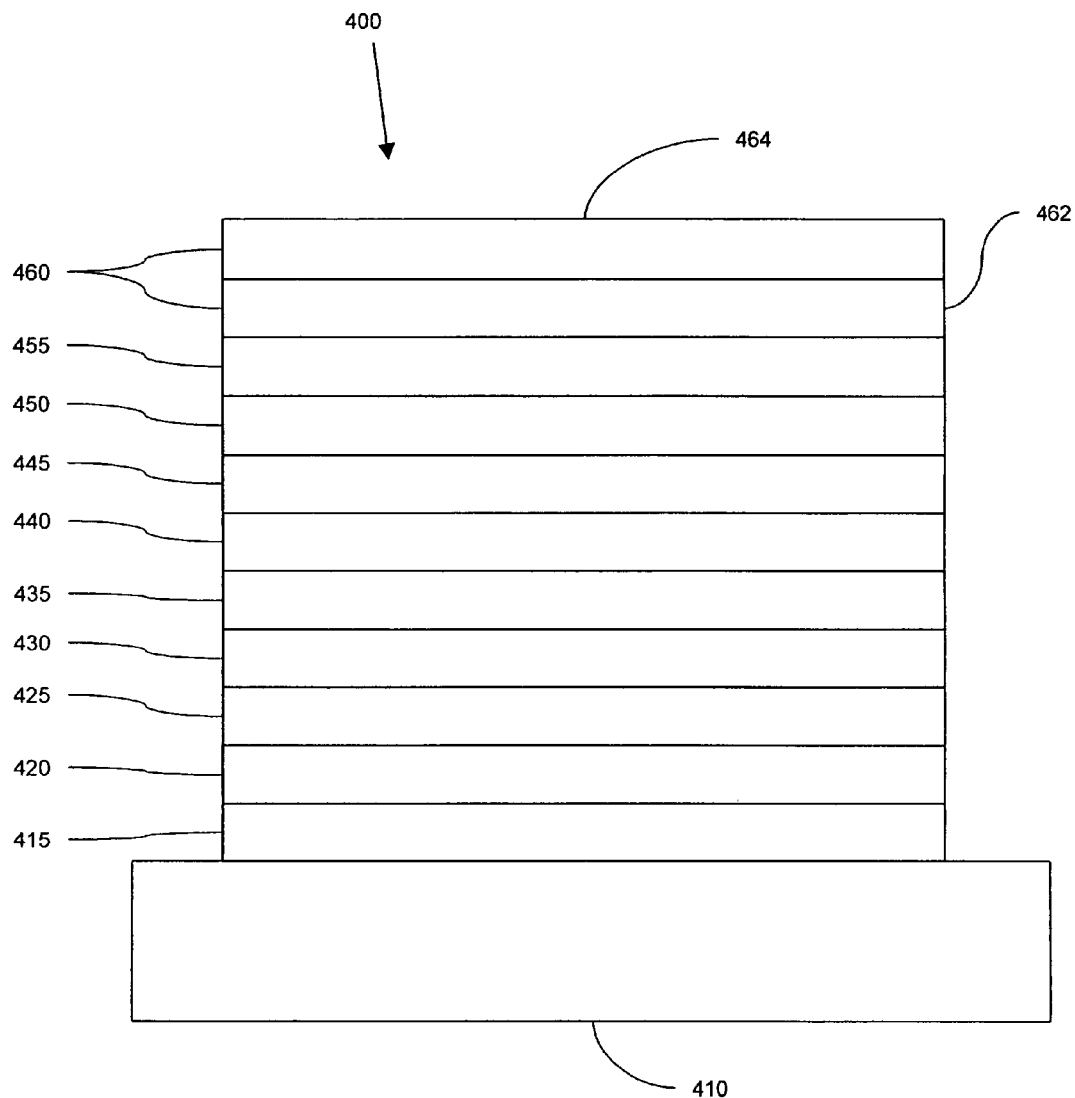
FIG. 4 shows an organic light emitting device.

FIG. 4 shows an organic light emitting device 400. The figures are not necessarily drawn to scale. Device 400 may include a substrate 410, an anode 415, a hole injection layer 420, a hole transport layer 425, an electron blocking layer 430, an emissive layer 435, a hole blocking layer 440, an electron transport layer 445, an electron injection layer 450, a protective layer 455, and a cathode 460. Cathode 460 is a compound cathode having a first conductive layer 462 and a second conductive layer 464. Device 400 may be fabricated by depositing the layers described, in order.

The specific composition and arrangement of layers illustrated in FIGS. 1 and 4 is exemplary only, and is not intended to be limiting. For example, some of the layers (such as blocking layers) may be omitted. Other layers (such as reflective layers and/or antireflective layers) may be added. For photosensitive devices, additional acceptor and donor layers may be used (i.e., tandem cells), or other types of organic photosensitive devices may be used that do not have separate organic acceptor and donor layers. Other types of OLEDs may be used, such as OLEDs without electron and/or hole transport layers. The order of layers may be altered. Arrangements other than those specifically described herein may be used. One of skill in the art, with the benefit of this disclosure, should be able to adapt various organic device configurations to a fiber structure.

The specific materials and structures described are exemplary in nature, and other materials and structures may be used. Functional devices may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in an OLED, an electron blocking layer may also function as a hole transport layer. In one embodiment, an OLED or photosensitive device may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The device structure may deviate from the simple layered structure illustrated in FIGS. 1 and 4. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

The substrate may be any suitable substrate that provides desired structural properties. The substrate may be flexible or rigid. The substrate may be transparent, translucent or opaque. Plastic and glass are examples of preferred rigid substrate materials. Plastic and metal foils are examples of preferred flexible substrate materials. The material and thickness of the substrate may be chosen to obtain desired structural and optical properties.

U.S. Pat. No. 6,352,777, incorporated herein by reference, provides examples of electrodes, or contacts, that may be used in an optoelectronic device. When used herein, the terms "electrode" and "contact" refer to layers that provide a medium for delivering photo-generated current to an external circuit or providing a bias voltage to the device. An electrode, or contact, provides the interface between the photoactive regions of an organic photosensitive optoelectronic device and a wire, lead, trace or other means for transporting the charge carriers to or from the external circuit. In a photosensitive optoelectronic device, it is desirable to allow the maximum amount of ambient electromagnetic radiation from the device exterior to be admitted to the photoconductively active interior region. Electromagnetic radiation reaches a photoconductive layer(s) may be converted to electricity by photoconductive absorption. This often dictates that at least one of the electrical contacts should be minimally absorbing and minimally reflecting of the incident electromagnetic radiation. Preferably, such a contact is substantially transparent. The opposing electrode may be a reflective material so that light which has passed through the cell without being absorbed is reflected back through the cell. As used herein, a layer of material or a sequence of several layers of different materials is said to be "transparent" when the layer or layers permit at least 50% of the ambient electromagnetic radiation in relevant wavelengths to be transmitted through the layer or layers. Similarly, layers which permit some, but less that 50% transmission of ambient electromagnetic radiation in relevant wavelengths are said to be "semi-transparent."

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between. In the context of a coaxial device or other non-planar configuration, "disposed over" means disposed further from the part of the structure that serves as a core or substrate, i. e., the part of the structure over which the rest of the structure is fabricated.

The electrodes are preferably composed of metals or "metal substitutes". Herein the term "metal" is used to embrace both materials composed of an elementally pure metal, e.g., Mg, and also metal alloys which are materials composed of two or more elementally pure metals, e.g., Mg and Ag together, denoted Mg:Ag. Here, the term "metal substitute" refers to a material that is not a metal within the normal definition, but which has the metal-like properties that are desired in certain appropriate applications. Commonly used metal substitutes for electrodes and charge transfer layers would include doped wide-bandgap semiconductors, for example, transparent conducting oxides such as indium tin oxide (ITO), gallium indium tin oxide (GITO), and zinc indium tin oxide (ZITO). In particular, ITO is a highly doped degenerate n+ semiconductor with an optical bandgap of approximately 3.2 eV, rendering it transparent to wavelengths greater than approximately 3900 Å. Another suitable metal substitute is the transparent conductive polymer polyanaline (PANI) and its chemical relatives. Metal substitutes may be further selected from a wide range of non-metallic materials, wherein the term "non-metallic" is meant to embrace a wide range of materials provided that the material is free of metal in its chemically uncombined form. When a metal is present in its chemically uncombined form, either alone or in combination with one or more other metals as an alloy, the metal may alternatively be referred to as being present in its metallic form or as being a "free metal". Thus, the metal substitute electrodes of the present invention may sometimes be referred to as "metal-free" wherein the term "metal-free" is expressly meant to embrace a material free of metal in its chemically uncombined form. Free metals typically have a form of metallic bonding that results from a sea of valence electrons which are free to move in an electronic conduction band throughout the metal lattice. While metal substitutes may contain metal constituents they are "non-metallic" on several bases. They are not pure free-metals nor are they alloys of free-metals. When metals are present in their metallic form, the electronic conduction band tends to provide, among other metallic properties, a high electrical conductivity as well as a high reflectivity for optical radiation.

Embodiments of the present invention may include, as one or more of the transparent electrodes of an optoelectronic device, a highly transparent, non-metallic, low resistance cathode such as disclosed in U.S. Pat. No. 6,420,031, to Parthasarathy et al. ("Parthasarathy '031"), or a highly efficient, low resistance metallic/non-metallic compound cathode such as disclosed in U.S. Pat. No. 5,703,436 to Forrest et al. ("Forrest '436"), both incorporated herein by reference in their entirety. Each type of cathode is preferably prepared in a fabrication process that includes the step of sputter depositing an ITO layer onto either an organic material, such as copper phthalocyanine (CuPc), to form a highly transparent, non-metallic, low resistance cathode or onto a thin Mg:Ag layer to form a highly efficient, low resistance metallic/non-metallic compound cathode.

Herein, the term "cathode" is used in the following manner. In a non-stacked PV device or a single unit of a stacked PV device under ambient irradiation and connected with a resistive load and with no externally applied voltage, e.g., a PV device, electrons move to the cathode from the photo-conducting material. In an OLED, electrons are injected into the device from the cathode. Similarly, the term "anode" is used herein such that in a PV device under illumination, holes move to the anode from the photo-conducting material, which is equivalent to electrons moving in the opposite manner. Holes It will be noted that as the terms are used herein, anodes and cathodes may be electrodes or charge transfer layers.

An organic photosensitive device will comprise at least one photoactive region in which light is absorbed to form an excited state, or "exciton", which may subsequently dissociate in to an electron and a hole. The dissociation of the exciton will typically occur at the heterojunction formed by the juxtaposition of an acceptor layer and a donor layer. For example, in the device of FIG. 1, the "photoactive region" may include donor layer 125 and acceptor layer 130.

The acceptor material may be comprised of, for example, perylenes, naphthalenes, fullerenes or nanotubules. An example of an acceptor material is 3,4,9,10-perylenetetracarboxylic bis-benzimidazole (PTCBI). Alternatively, the acceptor layer may be comprised of a fullerene material as described in U.S. Pat. No. 6,580,027, incorporated herein by reference in its entirety. Adjacent to the acceptor layer, is a layer of organic donor-type material. The boundary of the acceptor layer and the donor layer forms the heterojunction which may produce an internally generated electric field. The material for the donor layer may be a pthalocyanine or a porphyrin, or a derivative or transition metal complex thereof, such as copper pthalocyanine (CuPc). Other suitable acceptor and donor materials may be used.

Through the use of an organometallic material in the photoactive region, photosensitive devices incorporating such materials may efficiently utilize triplet excitons. It is believed that the singlet-triplet mixing may be so strong for organometallic compounds, that the absorptions involve excitation from the singlet ground states directly to the triplet excited states, eliminating the losses associated with conversion from the singlet excited state to the triplet excited state. The longer lifetime and diffusion length of triplet excitons in comparison to singlet excitons may allow for the use of a thicker photoactive region, as the triplet excitons may diffuse a greater distance to reach the donor-acceptor heterojunction, without sacrificing device efficiency. Materials other than organometallics may also be used.

In a preferred embodiment of the invention, the stacked organic layers of a photosensitive device include one or more exciton blocking layers (EBLs) as described in U.S. Pat. No. 6,097,147, Peumans et al, *Applied Physics Letters* 2000, 76, 2650-52, and co-pending application Ser. No. 09/449,801, filed Nov. 26, 1999, both incorporated herein by reference. In PV devices, higher internal and external quantum efficiencies have been achieved by the inclusion of an EBL to confine photogenerated excitons to the region near the dissociating interface and to prevent parasitic exciton quenching at a photosensitive organic/electrode interface. In addition to limiting the volume over which excitons may diffuse, an EBL can also act as a diffusion barrier to substances introduced during deposition of the electrodes. In some circumstances, an EBL can be made thick enough to fill pinholes or shorting defects which could otherwise render an organic PV device non-functional. An EBL can therefore help protect fragile organic layers from damage produced when electrodes are deposited onto the organic materials.

It is believed that the EBLs derive their exciton blocking property from having a LUMO-HOMO energy gap substantially larger than that of the adjacent organic semiconductor from which excitons are being blocked. Thus, the confined excitons are prohibited from existing in the EBL due to energy considerations. While it is desirable for the EBL to block excitons, it is not desirable for the EBL to block all charge. However, due to the nature of the adjacent energy levels, an EBL may block one sign of charge carrier. By design, an EBL will exist between two other layers, usually an organic photosensitive semiconductor layer and a electrode or charge transfer layer. The adjacent electrode or charge transfer layer will be in context either a cathode or an anode. Therefore, the material for an EBL in a given position in a device will be chosen so that the desired sign of carrier will not be impeded in its transport to the electrode or charge transfer layer. Proper energy level alignment ensures that no barrier to charge transport exists, preventing an increase in series resistance. For example, it is desirable for a material used as a cathode side EBL to have a LUMO energy level closely matching the LUMO energy level of the adjacent ETL material so that any undesired barrier to electrons is minimized.

It should be appreciated that the exciton blocking nature of a material is not an intrinsic property of its HOMO-LUMO energy gap. Whether a given material will act as an exciton blocker depends upon the relative HOMO and LUMO energy levels of the adjacent organic photosensitive material. Therefore, it is not possible to identify a class of compounds in isolation as exciton blockers without regard to the device context in which they may be used. However, with the teachings herein one of ordinary skill in the art may identify whether a given material will function as an exciton blocking layer when used with a selected set of materials to construct an organic PV device.

In a preferred embodiment of the invention, an EBL is situated between the acceptor layer and the cathode of a photosensitive device. A preferred material for the EBL comprises 2,9-dimethyl-4,7-diphenyl-1,10-phenanthroline (also called bathocuproine or BCP), which is believed to have a LUMO-HOMO energy level separation of about 3.5 eV, or bis(2-methyl-8-hydroxyquinolinoato)-aluminum(III)phenolate ($Alq_2OPH$). BCP is an effective exciton blocker which can easily transport electrons to the cathode from an acceptor layer.

The EBL layer may be doped with a suitable dopant, including but not limited to 3,4,9,10-perylenetracarboxylic dianhydride (PTCDA), 3,4,9,10-perylenetracarboxylic diimide (PTCDI), 3,4,9,10-perylenetetracarboxylic-bis-benzimidazole (PTCBI), 1,4,5,8-naphthalenetetracarboxylic dianhydride (NTCDA), and derivatives thereof. It is thought that the BCP as deposited in the present devices is amorphous. The present apparently amorphous BCP exciton blocking layers may exhibit film recrystallization, which is especially rapid under high light intensities. The resulting morphology change to polycrystalline material results in a lower quality film with possible defects such as shorts, voids or intrusion of electrode material. Accordingly, it has been found that doping of some EBL materials, such as BCP, that exhibit this effect with a suitable, relatively large and stable molecule can stabilize the EBL structure to prevent performance degrading morphology changes. It should be further appreciated that doping of an EBL which is transporting electrons in a giving device with a material having a LUMO energy level close to that of the EBL will help insure that electron traps are not formed which might produce space charge build-up and reduce performance. Additionally, it should be appreciated that relatively low doping densities should minimize exciton generation at isolated dopant sites. Since such excitons are effectively prohibited from diffusing by the surrounding EBL material, such absorptions reduce device photoconversion efficiency.

Representative embodiments of photoactive devices may also comprise transparent charge transfer layers or charge recombination layers. As described herein charge transfer layers are distinguished from acceptor and donor layers by the fact that charge transfer layers are frequently, but not necessarily, inorganic (often metals) and they may be chosen not to be photoconductively active. The term "charge transfer layer" is used herein to refer to layers similar to but different from electrodes in that a charge transfer layer only delivers charge carriers from one subsection of an optoelectronic device to the adjacent subsection. The term "charge recombination layer" is used herein to refer to layers similar to but different from electrodes in that a charge recombination layer allows for the recombination of electrons and holes between tandem photosensitive devices and may also enhance internal optical field strength near one or more photoactive layers. A charge recombination layer can be constructed of semi-transparent metal nanoclusters, nanoparticle or nanorods as described in U.S. Pat. No. 6,657,378, incorporated herein by reference in its entirety.

In a preferred embodiment of the invention, an anode-smoothing layer is situated between the anode and the donor layer. A preferred material for this layer comprises a film of 3,4-polyethylenedioxythiophene:polystyrenesulfonate (PEDOT:PSS). The introduction of the PEDOT:PSS layer between the anode (ITO) and the donor layer (CuPc) may lead to greatly improved fabrication yields. This is attributed to the ability of the spin-coated PEDOT:PSS film to planarize the ITO, whose rough surface could otherwise result in shorts through the thin molecular layers.

In a further embodiment on the invention, one or more of the layers may be treated with plasma prior to depositing the next layer. The layers may be treated, for example, with a mild argon or oxygen plasma. This treatment is beneficial as it reduces the series resistance. It is particularly advantageous that the PEDOT:PSS layer be subject to a mild plasma treatment prior to deposition of the next layer.

The simple layered structure illustrated in FIG. 1 is provided by way of non-limiting example, and it is understood that embodiments of the invention may be used in connection with a wide variety of other structures. The specific materials and structures described are exemplary in nature, and other materials and structures may be used. Functional devices may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. Organic layers that are not a part of the photoactive region, i.e., organic layers that generally do not absorb photons that make a significant contribution to photocurrent, may be referred to as "non-photoactive layers." Examples of non-photoactive layers include EBLs and anode-smoothing layers. Other types of non-photoactive layers may also be used.

Preferred organic materials for use in the photoactive layers of a photosensitive device include cyclometallated organometallic compounds. The term "organometallic" as used herein is as generally understood by one of ordinary skill in the art and as given, for example, in "Inorganic Chemistry" (2nd Edition) by Gary L. Miessler and Donald A. Tarr, Prentice Hall (1998). Thus, the term organometallic refers to compounds which have an organic group bonded to a metal through a carbon-metal bond. This class does not include per se coordination compounds, which are substances having only donor bonds from heteroatoms, such as metal complexes of amines, halides, pseudohalides (CN, etc.), and the like. In practice organometallic compounds generally comprise, in addition to one or more carbon-metal bonds to an organic species, one or more donor bonds from a heteroatom. The carbon-metal bond to an organic species refers to a direct bond between a metal and a carbon atom of an organic group, such as phenyl, alkyl, alkenyl, etc., but does not refer to a metal bond to an "inorganic carbon," such as the carbon of CN or CO. The term cyclometallated refers to compounds that comprise an bidentate organometallic ligand so that, upon bonding to a metal, a ring structure is formed that includes the metal as one of the ring members.

Organic layers may be fabricated using vacuum deposition, spin coating, organic vapor-phase deposition, inkjet printing and other methods known in the art.

Organic photosensitive optoelectronic devices of embodiments of the present invention may function as a PV, photodetector or photoconductor. Whenever the organic photosensitive optoelectronic devices of the present invention function as a PV device, the materials used in the photoconductive organic layers and the thicknesses thereof may be selected, for example, to optimize the external quantum efficiency of the device. Whenever the organic photosensitive optoelectronic devices of the present invention function as photodetectors or photoconductors, the materials used in the photoconductive organic layers and the thicknesses thereof may be selected, for example, to maximize the sensitivity of the device to desired spectral regions.

This result may be achieved by considering several guidelines that may be used in the selection of layer thicknesses. It is desirable for the exciton diffusion length, $L_D$, to be greater than or comparable to the layer thickness, L, since it is believed that most exciton dissociation will occur at an interface. If $L_D$ is less than L, then many excitons may recombine before dissociation. It is further desirable for the total photoconductive layer thickness to be of the order of the electromagnetic radiation absorption length, $1/\alpha$ (where $\alpha$ is the absorption coefficient), so that nearly all of the radiation incident on the PV device is absorbed to produce excitons. Furthermore, the photoconductive layer thickness should be as thin as possible to avoid excess series resistance due to the high bulk resistivity of organic semiconductors.

Accordingly, these competing guidelines inherently require tradeoffs to be made in selecting the thickness of the photoconductive organic layers of a photosensitive optoelectronic cell. Thus, on the one hand, a thickness that is comparable or larger than the absorption length is desirable (for a single cell device) in order to absorb the maximum amount of incident radiation. On the other hand, as the photoconductive layer thickness increases, two undesirable effects are increased. One is that due to the high series resistance of organic semiconductors, an increased organic layer thickness increases device resistance and reduces efficiency. Another undesirable effect is that increasing the photoconductive layer thickness increases the likelihood that excitons will be generated far from the effective field at a charge-separating interface, resulting in enhanced probability of geminate recombination and, again, reduced efficiency. Therefore, a device configuration is desirable which balances between these competing effects in a manner that produces a high external quantum efficiency for the overall device.

Organic photosensitive optoelectronic devices of may function as photodetectors. In this embodiment, the device may be a multilayer organic device, for example as described in U.S. application Ser. No. 10/723,953, filed Nov. 26, 2003, incorporated herein by reference in its entirety. In this case an external electric field may be generally applied to facilitate extraction of the separated charges.

A concentrator or trapping configuration can be employed to increase the efficiency of the organic photosensitive optoelectronic device, where photons are forced to make multiple passes through the thin absorbing regions. U.S. Pat. Nos. 6,333,458 and 6,440,769, incorporated herein by reference in their entirety, addresses this issue by using structural designs that enhance the photoconversion efficiency of photosensitive optoelectronic devices by optimizing the optical geometry for high absorption and for use with optical concentrators that increase collection efficiency. Such geometries for photosensitive devices substantially increase the optical path through the material by trapping the incident radiation within a reflective cavity or waveguiding structure, and thereby recycling light by multiple reflection through the photoresponsive material. The geometries disclosed in U.S. Pat. Nos. 6,333, 458 and 6,440,769 therefore enhance the external quantum efficiency of the devices without causing substantial increase in bulk resistance. Included in the geometry of such devices is a first reflective layer; a transparent insulating layer which should be longer than the optical coherence length of the incident light in all dimensions to prevent optical microcavity interference effects; a transparent first electrode layer adjacent the transparent insulating layer; a photosensitive heterostructure adjacent the transparent electrode; and a second electrode which is also reflective.

Coatings may be used to focus optical energy into desired regions of a device. U.S. patent application Ser. No. 10/857, 747, which is incorporated by reference in its entirety, provides examples of such a coating.

Organic solar cells typically consist of thin (about 100 nm) layers of molecular or polymeric organic compounds sandwiched between metal and ITO electrodes. The ITO may be sputtered onto glass or plastic sheets, the organic materials may be deposited by vacuum thermal evaporation (VTE), vapor phase deposition (OVPD), spin-casting or dip-coating. Metal cathodes may be thermally evaporated in vacuum. The device may be illuminated from the ITO side. Unlike the silicon photovoltaic cell, photon absorption may not immediately generate charge pairs. Photocurrent generation in this structure may occur in four consecutive steps: 1) photon absorption to generate a bound charge pair, known as the Frenkel exciton, 2) exciton diffusion to the donor-acceptor interface, 3) exciton dissociation into an electron-hole pair, and 4) collection of the electrons and holes at the electrodes. Generally, the donor material is chosen to have a low ionization potential (IP), while the acceptor material has a high electron affinity (EA), driving the exothermic dissociation of the exciton at the interface.

The individual layers may preferably be sufficiently thick for efficient absorption of light, while being within the characteristic diffusion length of the excitons. Table 1, below, provides a list of typical exciton diffusion lengths for some preferred organic PV cell materials.

| Material | $L_D$ (Å) Technique | Reference |
|---|---|---|
| | Small Molecule Systems | |
| PTCBI | 30 ± 3 PL quenching | (1) |
| PTCDA | 880 ± 60 from $\eta_{EQE}$ | (3) |
| PPEI | ~700 PL quenching | (5) |
| CuPc | 100 ± 30 from $\eta_{EQE}$ | (1) |
| | 680 ± 200 from $\eta_{EQE}$ | (6) |
| ZnPc | 300 ± 100 from $\eta_{EQE}$ | (7) |
| $C_{60}$ | 400 ± 50 from $\eta_{EQE}$ | (1) |
| | 141 from $\eta_{EQE}$ | (2) |
| $Alq_3$ | 200 | (8) |
| | ~200 | (9) |
| | Polymer Systems | |
| PPV | 70 ± 10 from $\eta_{EQE}$ | (4) |
| | 120 ± 30 from $\eta_{EQE}$ | (6) |
| PEOPT | 47 from $\eta_{EQE}$ | (2) |
| | 50 PL quenching | (10) |

In the above table, PPEI is perylene bis(phenethylimide), $alq_3$ is tris(8-hydroxyquinoline)aluminum, CuPc is copper phthalocyanine, ZnPc is zinc phthalocyanine. The result for PPEI is calculated using the result for a $SnO^2$ quenching surface and assuming infinite surface recombination velocity. The results leading to $L_D$ for PPEI of 2.5±0.5 µm are likely influenced by quencher diffusion and morphological changes during solvent vapor assisted annealing. The result for PPV with 120±30 does not take into consideration optical interference effects. The diffusion length measurements were obtained from the following sources: (1) Peumans, P.; Yakimov, A.; Forrest, S. R., J. Appl. Phys. 2003, 93, 3693; (2) L. A. A. Pettersson et al., J. Appl. Phys., 86, 487 (1999); (3) V. Bulovic and S. R. Forrest, Chem. Phys. 210, 13 (1996); (4) J. J. M. Halls et al., Appl. Phys. Lett. 68, 3120 (1996); (5) B. A. Gregg et al., J. Phys. Chem. B 101, 5362 (1997); (6) T. Stübinger and W. Brütting, J. Appl. Phys. 90, 3632 (2001); (7) H. R. Kerp and E. E. van Faassen, Nord. Hydrol. 1, 1761 (1999); (8) A. L. Burin and M. A. Ratner, J. Phys. Chem. A 104, 4704 (2000); (9) V. E. Choong et al., J. Vac. Sci. Technol. A 16, 1838 (1998); (10) M Theander, et al., Phys. Rev. B 61, 12957 (2000).

Because of high absorption coefficients in many organic compounds (e.g., copper phthalocyanine), on balance this leads to desirable layer thicknesses of 100 to 1000 Å—much thinner than the active layers in silicon-based or Grätzel photovoltaic cells. The organic molecules and polymer chains may be held together by van der Waals forces, and may form low-density (1.1 g/cm$^3$) solid films at ambient conditions. The films can be deposited at low substrate temperatures, allowing organic photovoltaic cells to be built on a variety of substrates, without need to lattice match the active layers to the substrate, and at a modest thermal budget.

Tang and Van Slyke demonstrated an organic heterojunction photovoltaic cell in 1986, having a quantum efficiency of 1%. Primarily, however, this first heterojunction photovoltaic cell was limited because of the short diffusion length of excitons, which caused most of the generated excitons to decay (into phonons) before reaching the interface. Progress in flat heterojunction organic photovoltaic cells has been slow, until recently, when materials such as $C_{60}$ having long exciton diffusion lengths were introduced, as well as novel device structures, such as the bulk heterojunction.

The bulk heterojunction may be an interpenetrating network of donor and acceptor materials. Unlike a substantially flat heterojunction, the absorption of a photon may occur near the donor-acceptor interface, increasing the probability of charge dissociation. To fabricate the bulk heterojunction, a mixed donor-acceptor molecular film may be deposited on a substrate and annealed, to induce phase-separation. Similarly, two polymers may be spin-cast and allowed to phase-segregate, producing an interpenetrating structure. Efficiencies as high as 3.5% have been achieved in both polymer and small molecule systems.

General information regarding $C_{60}$ and efficiencies may be available at, for example, Peumans, P. and S. R. Forrest, *Very-High-Efficiency Double-Heterostructure Copper Phthalocyanine/C60 Photovoltaic Cells,* Applied Physics Letters, 2001, 79(1): p. 126. General information regarding bulk heterojunction (bulk heterojunction) structures may be found at Peumans, P., S. Uchida, and S. R. Forrest, *Efficient Bulk Heterojunction Photovoltaic Cells Using Small-Molecular-Weight Organic Thin Films,* Nature, 2003, 425(6954): p. 158 and/or Shaheen, S. E., et al., *2.5% Efficient Organic Plastic Solar Cells,* Applied Physics Letters, 2001, 78(6): p. 841.

Greater gains may be anticipated by using better organic materials, tandem photovoltaic cells, and metallic nanoclusters. The preceding list is exemplary and is not intended to be exclusive. General information regarding metallic nanoclusters may be found in Yakimov, A. and S. R. Forrest, *High Photovoltage Multiple-Heterojunction Organic Solar Cells Incorporating Interfacial Metallic Nanoclusters.* Applied Physics Letters, 2002, 80(9) p. 1667-1669.

While known organic photovoltaic cells may not be more efficient than silicon or Grätzel cells, they are potentially easier and less expensive to produce. Organic materials also allow a broader choice of substrates. Disclosed in one embodiment herein is a method of fabrication of an organic photovoltaic cell (in fiber form) that, with the present state of the art and materials, should result in 3.5% or greater efficient solar cells, but at a significantly reduced cost and in a more versatile form factor than in comparison with known organic photovoltaic cells.

Figure 2:
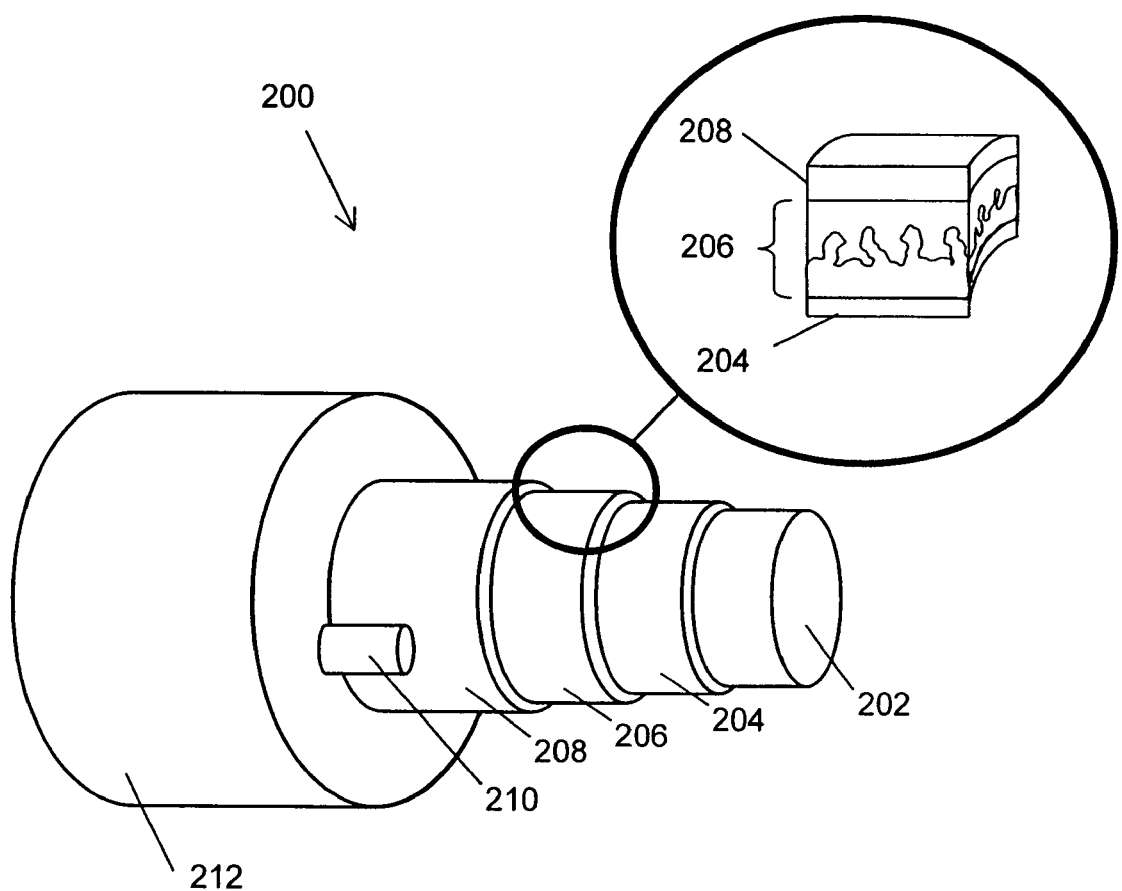
FIG. 2 shows a photoactive fiber.

FIG. 2 shows a representation of a photoactive fiber structure 200 in accordance with an embodiment of the invention. For clarity of illustration, FIG. 2 may not be to scale. The photoactive fiber structure 200 may comprise a support element 202; a first electrode 204, which may substantially surround the support element 202; an organic layer 206, which may substantially surround the first electrode layer 204 and which comprises a photoactive region; a second electrode 208, which may substantially surround the organic layer 206; and a auxiliary conductor 210, which may be in electrical contact with some surface of the transparent electrode 208. The photoactive fiber structure 200 in accordance with an embodiment of the invention may further comprise an outer layer 212.

In one embodiment, support element 202 may be fabricated of a flexible solid material. Examples may include an optical fiber, a telecommunications fiber, and a solid nylon strand. In one embodiment, the core may be a solid nylon strand. Other materials are acceptable without departing from the scope of the invention, and a wide variety of dimensions may be used depending upon the structural requirements of a particular application. Together, support element 202 and first electrode 204 comprise a "conductive core." Support element 202 may be conductive or non-conductive. In one embodiment, the conductive core may be a single element, without the need for a support element 202 separate from first electrode 204. Preferable, such a conductive core comprises a material that provides sufficient structural properties and conductivity. Metal wires are a preferred example of such a conductive core. Whether or not there is a separate support element 202, first electrode 204 may be comprised of two or more layers (such as, for example, a first layer of aluminum surrounded by a second layer of lithium). Examples of suitable conductive materials include silver, gold, copper, and aluminum. Other conductive materials may be used. Preferably, the conductive core is flexible.

In one embodiment, organic layer 206 may be a polymer or small-molecular bulk heterojunction coating. In one embodiment, the organic layer 206 may range in thickness from about 1 to 200 nm. Examples of polymer or small-molecular bulk heterojunction coatings include PCBM-nMDMO-PPV and CuPc-$C_{60}$, respectively. As used herein, PCBM is 6,6-phenyl-C61-Butyl acid-methylester MDMO-PPV is poly(2-methoxy-5-(3',7'-dimethyloctyloxy)-1,4-phenylene-vinylene)

PPV is poly(1,4-phenylene-vinylene)

$C_{60}$ is buckminsterfullerene

PtOEP is 2,3,7,8,12,13,17,18-Octaethyl-21H,23H-porphine platinum (II) (also platinum octaethylporphyrin)

PTCBI is 3,4,9,10-perylenetetracarboxylic bis-benzimidazole

Other organic layers, such as a planar heterojunction layer or a mixed heterojunction layer, as well as other material combinations, that provide photogeneration may also be selected without departing from the scope of the invention.

In one embodiment, second electrode 208 may be transparent and comprise a polymer comprised of PEDOT-PSS. ITO is another preferred material. Preferably, second electrode 208 is transparent and flexible. Other transparent electrode materials, whether metallic or non-metallic, may also be selected without departing from the scope of the invention.

In one embodiment, the outer layer 212 may be an optically transparent nylon. Other materials may also be used. Depending upon the amount of protection from the environment that is needed, and the amount of such protection that is provided by other layers such as second electrode 208, outer layer 212 may be omitted.

Figure 3:
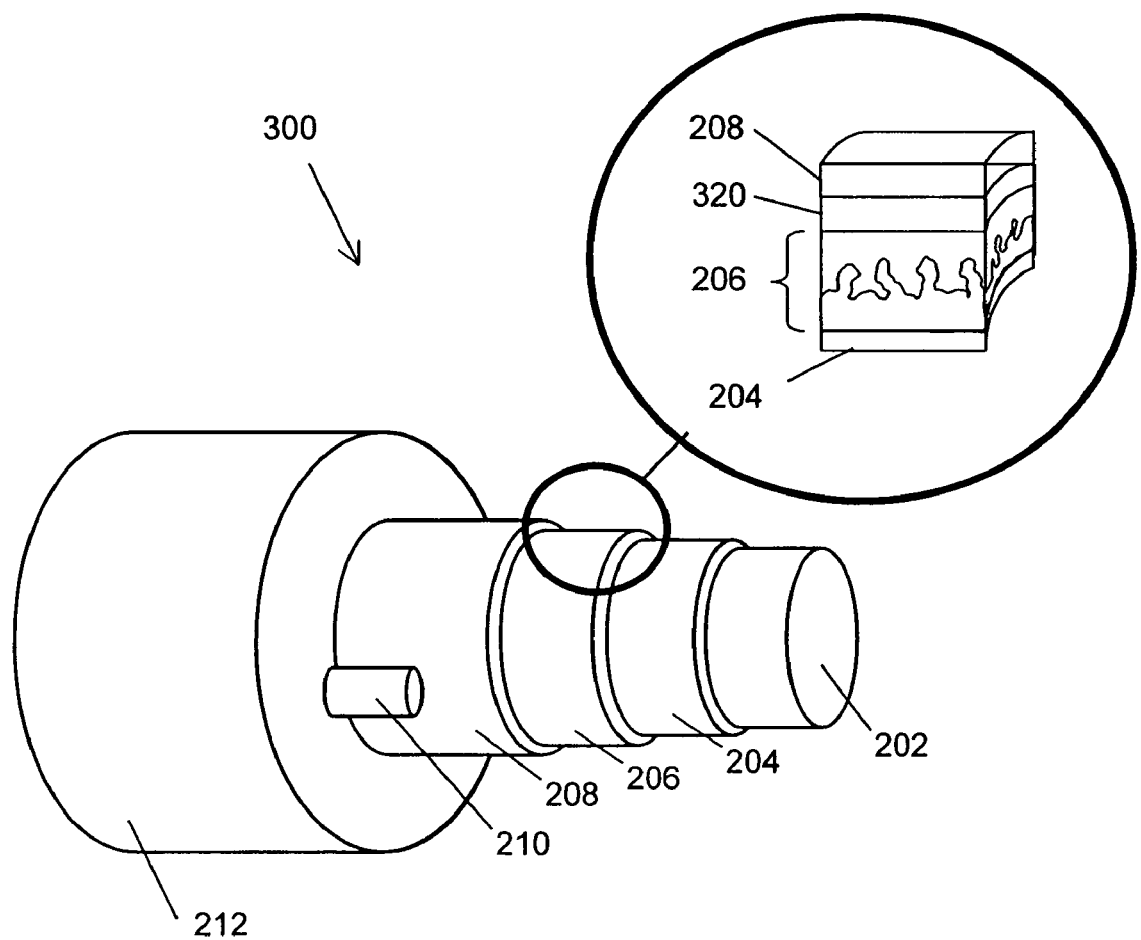
FIG. 3 shows a photoactive fiber including a blocking layer.

In industrial practice it may be difficult to control the azimuth orientation of a photoactive fiber structure (similar to 200, FIG. 2) in, for example, a cloth within which the fiber may be woven. In some cloth configurations, only 25% of a photoactive fiber's surface may be usefully exposed (compared to 50% in a conventional flat photovoltaic cell). A second electrode 208, comprised of, for example, ITO or PEDOT-PSS polymer, may be used. However, transparent electrodes, such as those comprised of ITO and PEDOT-PSS, may be typically too resistive to conduct current along a length greater than about 1 cm. Accordingly, a auxiliary conductor 210 may be applied to and may be in electrical contact with both organic layer 206 and second electrode 208. The auxiliary conductor 210 may extract current over the entire length of the photoactive fiber structure 200. In an embodiment, the auxiliary conductor 210 may be comprised of, for example, sliver, gold, copper, or aluminum. The auxiliary conductor 210 may be electrically coupled to second electrode 208, and may cover from about 5 percent to about 50 percent of an external surface of second electrode 208. Additionally, while depicted in FIG. 2 as a solid wire, the auxiliary conductor may be any of at least a metallic wire, a metallized wire, a metallic ribbon, a metallized ribbon, and a metallic coating. The auxiliary conductor 210 may be wound about the photoactive fiber structure 200, or may be applied in a direction substantially parallel to the axis of support element 202. If wound, it is preferred that the duty cycle be low, such that the amount of surface covered by auxiliary conductor 210 is minimized, because auxiliary conductor 210 is not necessarily transparent and it is desirable to minimize the amount of light that is blocked by the auxiliary conductor. The "duty cycle" is the axial distance along a fiber in which auxiliary conductor 210 makes a complete revolution. A duty cycle of at least the circumference of the second electrode is preferred, to avoid blocking light from too much of the active region. For most materials that may be desirable for use as second electrode 208, and for most fiber dimensions, it is expected that conduction in the axial direction, and not conduction around the circumference of electrode 208, will be the issue addressed by auxiliary conductor 210, such that there may not be a significant conductivity benefit to a very small duty cycle. Where the solar fiber may be incorporated into a product such that the orientation of auxiliary conductor 210 is not readily controlled, such as weaving into certain cloths where only a part of the fiber is expected to be exposed to light, it may be preferred winding auxiliary conductor 210 with a duty cycle sufficiently low to avoid a situation where a fiber has an auxiliary conductor 210 is always oriented towards a light source so as to block a substantial fraction of the part of the fiber exposed to light. Furthermore, in an embodiment, the auxiliary conductor 210 may be a braid of electrical conductors (not shown) surrounding second electrode 208, where the degree of occlusion from the braid is preferably no more than about 50 percent. Although FIG. 3 illustrates an auxiliary conductor 210 that is separated from organic layer 206 by second electrode 208, such separation is not necessary and auxiliary conductor 210 may contact organic layer 206. For example, auxiliary conductor 210 may be fabricated prior to second electrode 208.

FIG. 3 shows a representation of a photoactive fiber structure 300 similar to that of the photoactive fiber structure of FIG. 2, further including an exciton blocking layer 320, in accordance with an embodiment of the invention. The exciton blocking layer 320 may comprise a non-photoactive layer disposed between organic layer 206 and second electrode 208 such that non-photoactive exciton blocking layer 320 is electrically coupled to each of organic layer 206 and second electrode 208. Preferably, exciton blocking layer 320 is organic. For ease of illustration, exciton blocking layer 320 is shown only in the magnified portion of FIG. 3. Other non-photoactive layers, preferably organic, may be be included in a photoactive fiber structure, between first electrode 204 and second electrode 208. For example, blocking layers, smoothing layers, and any other layers that are known or may become known to the art may be incorporated into the fiber structure.

One method of making a photoactive fiber structure 200 in accordance with the invention is coat a telecommunications fiber with ITO and then use vacuum thermal evaporation or dip-coating to deposit active organic layer(s). A conductor (similar to 210, FIG. 2) may be deposited using vacuum evaporation, after which the photoactive fiber may be tested using common electrical probing techniques.

The dimensions of a practical photoactive fiber are subject to its architecture, and both will be established simultaneously and somewhat iteratively. In general, when considering a generalized cylindrical device geometry as may be used in a flexible photoactive fiber woven into fabric, the overall fiber thickness may range from about 10-100 μm, including the outer layer (similar to 212, FIG. 2), while the active organic layers (e.g., organic layer 206) may typically be only about 100 nm thick.

The optical power absorbed by the active organic layers (e.g., organic layer 206) is given approximately by:

$$P_{opt} \geq \Phi \cdot d \cdot L \quad (2)$$

where, $\Phi$, $r_2$, and L denote the optical flux, fiber radius at the anode, and uninterrupted fiber length, respectively. The resulting total photocurrent is given by:

$$I_{PG} = \frac{P_{opt} \cdot \eta_{pwr}}{V_{OC} \cdot FF} \quad (3)$$

where, $\mu_{pwr}$, FF, and $V_{oc}$ denote the photovoltaic cell power efficiency, fill factor, and open-circuit voltage, respectively. (The power efficiency, $\eta_{pwr}$ accounts for any additional absorption losses to the incident solar flux in the structure.) The power produced in the load circuit is:

$$P_{load} = V_{drop} \cdot I_{load} = (0.05 \cdot FF \cdot V_{oc}) \cdot I_{PG} \quad (4)$$

where, 5% voltage drop was allowed along the length of the fiber and $I_{PG} = I_{load}$ during operation. At the same time, Ohm's law dictates:

$$\frac{(0.05 \cdot FF \cdot V_{OC})}{I_{load}} = \frac{\rho \cdot L}{A_{CS}} \quad (5)$$

where, ρ is the resistivity of the anode (e.g., second electrode 208 and/or auxiliary conductor 210), while $A_{cs} \approx \pi \cdot d \cdot t$ is the cross-sectional area of the anode. Combining equations (2)-(5) obtains:

$$t \geq \frac{\rho \cdot L^2 \cdot \Phi \cdot \eta_{pwr}}{.05 \cdot FF^2 \cdot V_{OC}^2} \quad (6)$$

If aluminum ($\rho=5\cdot10^{-8}$ $\Omega\cdot$m) were used as an inner conductor (similar to 204, FIG. 2), and given $\eta_{pwr}=3\%$, FF=0.5, Voc=0.5V, an estimate of the minimum thickness, in meters, of the inner conductor (similar to 204, FIG. 2) would be:

$$t \geq 5\cdot10^{-6} \cdot L^2 \quad (7)$$

where, L is also expressed in meters. Thus, a 5 μm thick coating of Al can be used if the current is tapped out every 10 cm. This also sets the diameter of the conductor, viz.:

$$\pi \cdot d \cdot t = \pi \cdot d_{au}^2/4 \quad (8)$$

where, $d_{au}$ is the diameter of the auxiliary conductor, such as auxiliary conductor 210, FIG. 2. Accordingly, from above, $d_{au}$=30 μm.

In one embodiment, the photoactive fiber structure 200, including the auxiliary conductor 210 may be wound together and then encapsulated by, for example, a 10 μm thick outer layer 212 to result in a slightly oblong cross-section photoactive fiber structure that is about 110 μm across its major diameter. This diameter may be suitable for typical textile processing equipment and incorporation into industrial and personal-use fabric.

It is believed that photoactive fiber structure in accordance with an embodiment of the invention may be fabricated at low-cost and incorporated into the high-speed manufacturing of textiles. One possible continuous fabrication sequence may be to draw a metal or a metallized nylon core through a melt containing a blend of photosensitive polymer. The photosensitive polymer may dry and phase separate, resulting in a bulk heterojunction structure surrounding the core. The core may then be coated with a conducting polymer (e.g., PEDOT). The conductor may be introduced and wound together with the photogenerating core at a low duty cycle, or may be linearly applied in a direction substantially parallel to the axis of the core of the photoactive fiber, to allow sufficient light absorption in the photoactive fiber. Finally, the entire photoactive fiber may be "finished" by encapsulation in a transparent plastic sheath or other protective outer layer to help to protect it from mechanical (e.g., abrasive) and environmental damage.

Ultimately, the feasibility of installed solar panels depends on the cost of raw materials, fabrication, module assembly, transport, and on-site installation. While estimates of the final cost of mass-manufactured photoactive fibers are only approximate, it is expected to be less than that of silicon photovoltaic cells. The mass of photoactive polymer used in the photoactive fiber can be calculated from the dimensions obtained above. A 1 m long fiber will require ~$10^{-5}$ mg of dry photoactive polymer, and a 1 $m^2$ swath of cloth woven from the photoactive fiber will use ~0.1 g of it. Chemicals such as $C_{60}$ are currently available in large quantities for <$30/gram (99% pure), and their price can be expected to drop in the near future. Nylon cloth is available to consumers at prices from $1 to $20 per $m^2$, depending on the weave, treatment, and strength, and at substantially lower cost to large-volume customers. A 3% efficient 1 $m^2$ photovoltaic cell can generate on average 30 Watts of electrical power. If the photoactive fiber cost is in the range of technical synthetic-based fabric price, the generated power can cost between ~$0.1 and $0.8/Watt. A typical silicon-based solar cell has a $3-4/Watt installed cost. Furthermore, producing solar cells in the form of mechanically robust flexible fabric can greatly reduce installation costs compared to heavy and bulky silicon photovoltaic modules.

The nature of the polymers used to fabricate the photoactive fiber may preferably satisfy several optical, electrical, mechanical, and rheological requirements. To maximize the efficiency of a solar cell, the absorption spectrum of the photo-generating layer should overlap the solar radiation spectrum as much as possible. Conjugated polymers typically have band gaps >2 eV, which omits a significant portion of the incident solar radiation. The structure and composition of the active polymers can be modified to include the low-energy part of the solar spectrum using small-molecular-like side-branches and functional groups like $C_{60}$. See, generally, Brabec, C. J., et al., *Organic Photovoltaic Devices Produced From Conjugated Polymer/Methanofullerene Bulk Heterojunctions*, Synthetic Metals, 2001, 121(1-3): p. 1517; Shaheen, S. E., et al., *Low Band-Gap Polymeric Photovoltaic Devices*, Synthetic Metals, 2001, 121: p. 1583.

However, structural modification of the polymer will also affect its melting temperature, Theological behavior, and crystalline order. While polymer melt rheology is a well-studied topic, few studies exist dealing with rheology of polymers used in photovoltaic cells; many have been synthesized only in the last 5 years.

In addition to modifying the chemical structure of the photoactive polymer, the optical absorption may be improved ("sensitized") by doping low band-gap dye molecules into the host film. However, the excitons created on the dye molecules remain trapped due to their lower energy relative to the surrounding polymer matrix. Engineering a three-phase morphology on the nanometer scale, similar to that employed in a Grätzel cell may surmount this limitation. An amphiphilic dopant molecule may be mixed in with hydrophobic and hydrophilic polymers, such that upon annealing the amphiphilic dopant may create a third phase at the boundary between the two polymer phases. The net effect may be to absorb and immediately dissociate a low-energy exciton at the ternary interface.

Charge and exciton hopping between neighboring chains also limit the output current of a photovoltaic cell. The operating hypothesis for barrier coating design is that diffusion of chemical species (e.g. $O_2$ and $H_2O$) into the photovoltaic cell causes decomposition of the photo- and electrically active compounds, accelerated by thermal and optical stresses. While moisture diffusion coefficients can be low in some polymeric materials, oxygen diffusion is more difficult to prevent. Metallic coatings are frequently used in some applications (e.g. food packaging, optical fiber coating, etc.), but they also block solar flux. Instead, transparent oxide (e.g. $TiO_2$, $SiO_2$, and Al2O3) coatings can be used for the solar fiber. The difficulty in using oxide thin films as diffusion barriers in organic-based devices stems from a processing and application points of view. The deposition temperature for high-quality, dense oxides is typically high (>500° C.), while the decomposition temperature of the organic materials is typically low (<500° C.). The oxides are also brittle, with thermal expansion coefficients different from polymers, so that cracks are easily formed during handling and use. Barrier coatings have been developed, where alternating polymer and sputtered metal-oxide inorganic thin films are employed. See, e.g., Burrows, P. E., et al., *Gas Permeation and Lifetime Tests on Polymer-Based Barrier Coatings*, in SPIE Annual Meeting, 2000. The inorganic layers act to block the diffusion of chemical species harmful to the device, while the polymer interlayers act to cushion and mechanically decouple the oxide layers. Low-cost synthetic approaches, such as sol-gel synthesis of oxides may also be acceptable.

For OLED embodiments, organic layer 206 may comprise the organic layers of an organic light emitting device. Such layers are illustrated (in a planar fashion) in FIG. 4, and described in further detail above and below. An auxiliary conductor may be used in an OLED embodiment to provide current.

Hole transport layer 425 may include a material capable of transporting holes. Hole transport layer 430 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in United States Patent Application Publication No. 2002-0071963 A1 to Forrest et al., which is incorporated by reference in its entirety. Other hole transport layers may be used Emissive layer 435 may include an organic material capable of emitting light when a current is passed between anode 415 and cathode 460. Preferably, emissive layer 435 contains a phosphorescent emissive material, although fluorescent emissive materials may also be used. Phosphorescent materials are preferred because of the higher luminescent efficiencies associated with such materials. Emissive layer 435 may also comprise a host material capable of transporting electrons and/or holes, doped with an emissive material that may trap electrons, holes, and/or excitons, such that excitons relax from the emissive material via a photoemissive mechanism. Emissive layer 435 may comprise a single material that combines transport and emissive properties. Whether the emissive material is a dopant or a major constituent, emissive layer 435 may comprise other materials, such as dopants that tune the emission of the emissive material. Emissive layer 435 may include a plurality of emissive materials capable of, in combination, emitting a desired spectrum of light. Examples of phosphorescent emissive materials include $Ir(ppy)_3$. Examples of fluorescent emissive materials include DCM and DMQA. Examples of host materials include $Alq_3$, CBP and mCP. Examples of emissive and host materials are disclosed in U.S. Pat. No. 6,303,238 to Thompson et al., which is incorporated by reference in its entirety. Emissive material may be included in emissive layer 435 in a number of ways. For example, an emissive small molecule may be incorporated into a polymer. This may be accomplished by several ways: by doping the small molecule into the polymer either as a separate and distinct molecular species; or by incorporating the small molecule into the backbone of the polymer, so as to form a co-polymer; or by bonding the small molecule as a pendant group on the polymer. Other emissive layer materials and structures may be used. For example, a small molecule emissive material may be present as the core of a dendrimer.

Many useful emissive materials include one or more ligands bound to a metal center. A ligand may be referred to as "photoactive" if it contributes directly to the photoactive properties of an organometallic emissive material. A "photoactive" ligand may provide, in conjunction with a metal, the energy levels from which and to which an electron moves when a photon is emitted. Other ligands may be referred to as "ancillary." Ancillary ligands may modify the photoactive properties of the molecule, for example by shifting the energy levels of a photoactive ligand, but ancillary ligands do not directly provide the energy levels involved in light emission. A ligand that is photoactive in one molecule may be ancillary in another. These definitions of photoactive and ancillary are intended as non-limiting theories. Note that the term "photoactive" as used herein generally means pertaining directly to the absorption or emission of light. The specific meanings provided in the contexts of an OLED as opposed to a photosensitive device are contextual applications of the general definition.

Electron transport layer 440 may include a material capable of transporting electrons. Electron transport layer 440 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in United States Patent Application Publication No. 2002-0071963 A1 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) energy level of the electron transport layer. The "charge carrying component" is the material responsible for the LUMO energy level that actually transports electrons. This component may be the base material, or it may be a dopant. The LUMO energy level of an organic material may be generally characterized by the electron affinity of that material and the relative electron injection efficiency of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Blocking layers in an OLED may be used to reduce the number of charge carriers (electrons or holes) and/or excitons that leave the emissive layer. An electron blocking layer 430 may be disposed between emissive layer 435 and the hole transport layer 425, to block electrons from leaving emissive layer 435 in the direction of hole transport layer 425. Similarly, a hole blocking layer 440 may be disposed between emissive layer 135 and electron transport layer 445, to block holes from leaving emissive layer 435 in the direction of electron transport layer 440. Blocking layers may also be used to block excitons from diffusing out of the emissive layer. The theory and use of blocking layers is described in more detail in U.S. Pat. No. 6,097,147 and United States Patent Application Publication No. 2002-0071963 A1 to Forrest et al., which are incorporated by reference in their entireties.

As used herein, and as would be understood by one skilled in the art, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer. Also, a blocking layer may be used to confine emission to a desired region of an OLED.

Generally, injection layers are comprised of a material that may improve the injection of charge carriers from one layer, such as an electrode or an organic layer, into an adjacent organic layer. Injection layers may also perform a charge transport function. In device 400, hole injection layer 420 may be any layer that improves the injection of holes from anode 415 into hole transport layer 425. CuPc is an example of a material that may be used as a hole injection layer from an ITO anode 415, and other anodes. In device 400, electron injection layer 450 may be any layer that improves the injection of electrons into electron transport layer 445. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 400. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO energy level that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 400, protective layer 455 may reduce damage to underlying organic layers during the fabrication of cathode 460. Preferably, a protective layer has a high carrier mobility for the type of carrier that it transports (electrons in device 400), such that it does not significantly increase the operating voltage of device 400. CuPc, BCP, and various metal phthalocyanines are examples of materials that may be used in protective layers. Other materials or combinations of materials may be used. The thickness of protective layer 455 is preferably thick enough that there is little or no damage to underlying layers due to fabrication processes that occur after organic protective layer 460 is deposited, yet not so thick as to significantly increase the operating voltage of device 400. Protective layer 455 may be doped to increase its conductivity. For example, a CuPc or BCP protective layer 460 may be doped with Li. A more detailed description of protective layers may be found in U.S. patent application Ser. No. 09/931,948 to Lu et al., which is incorporated by reference in its entirety.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

The molecules disclosed herein may be substituted in a number of different ways without departing from the scope of the invention. For example, substituents may be added to a compound having three bidentate ligands, such that after the substituents are added, one or more of the bidentate ligands are linked together to form, for example, a tetradentate or hexadentate ligand. Other such linkages may be formed. It is believed that this type of linking may increase stability relative to a similar compound without linking, due to what is generally understood in the art as a "chelating effect."

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.)

Although the present invention is described with respect to particular examples and preferred embodiments, it is understood that the present invention is not limited to these examples and embodiments. The present invention as claimed may therefore include variations from the particular examples and preferred embodiments described herein, as will be apparent to one of skill in the art.

What is claimed is:

1. A method, comprising:

coating a conductive core including a first electrode with an organic photoactive layer, said organic photoactive layer surrounding the conductive core and electrically connected to the first electrode, wherein the organic photoactive layer comprises a donor type material and an acceptor type material forming a donor-acceptor heterojunction that forms excitons by absorption of photons in the organic photoactive layer, wherein the excitons formed in the organic photoactive layer are within an exciton diffusion length of a donor-acceptor interface; and depositing a transparent second electrode over the organic photoactive layer, whereby the second electrode is surrounding the organic photoactive layer and electrically connected to the organic photoactive layer, wherein the first electrode, the organic photoactive layer and the second electrode form a photosensitive device.

2. The method of claim 1, further comprising applying an electrically conductive conductor over the second electrode.

3. The method of claim 1, wherein the conductive core is coated with the organic layer by at least one of dip-coating, vacuum thermal evaporation, organic vapor-phase deposition, and organic vapor jet deposition.

4. The method of claim 1, wherein the donor-acceptor heterojunction is a bulk heterojunction.

5. The method of claim 1, wherein the organic photoactive layer has a thickness that is comparable to electromagnetic radiation absorption length.

6. The method of claim 1, wherein the organic photoactive layer has a thickness between 1-200 nm.

* * * * *